US006724267B2

(12) United States Patent
Kim

(10) Patent No.: US 6,724,267 B2
(45) Date of Patent: Apr. 20, 2004

(54) VOLTAGE CONTROLLED OSCILLATOR

(75) Inventor: Beomsup Kim, Cupertino, CA (US)

(73) Assignee: Berkana Wireless, Inc., Campbell, CA (US)

( * ) Notice: Subject to any disclaimer, the term of this patent is extended or adjusted under 35 U.S.C. 154(b) by 0 days.

(21) Appl. No.: 10/003,729

(22) Filed: Nov. 14, 2001

(65) Prior Publication Data

US 2003/0090329 A1 May 15, 2003

(51) Int. Cl.[7] .............................................. H03B 27/00
(52) U.S. Cl. ....................... 331/57; 331/46; 331/117 R; 331/167
(58) Field of Search ............................ 331/57, 167, 46, 331/117 R, 117 FE

(56) References Cited

U.S. PATENT DOCUMENTS 5,561,398 A * 10/1996 Rasmussen ............... 331/36 C
6,094,103 A * 7/2000 Jeong et al. ................... 331/57

FOREIGN PATENT DOCUMENTS

KR 10-268050 7/2000
KR 10-0278551 10/2000

* cited by examiner

*Primary Examiner*—Robert Pascal
*Assistant Examiner*—Kimberly E Glenn
(74) *Attorney, Agent, or Firm*—Van Pelt & Yi LLP

(57) ABSTRACT

A cascaded voltage controlled oscillator is described that includes a first oscillator stage having a first oscillator stage first input, a first oscillator stage second input and a first oscillator stage output. A second oscillator stage includes a second oscillator stage input and a second oscillator stage output wherein the first oscillator stage output is input to the second oscillator stage input and wherein the second oscillator stage output is fed back to the first oscillator stage second input. A third oscillator stage includes a third oscillator stage input and a third oscillator stage output wherein the second oscillator stage output is fed to the third oscillator stage input.

5 Claims, 5 Drawing Sheets

VOLTAGE CONTROLLED OSCILLATOR

CROSS REFERENCE TO RELATED APPLICATIONS

This application is related to co-pending U.S. patent application Ser. No. 10/004,521 entitled PHASE SYNCHRONOUS MULTIPLE TANK OSCILLATOR filed concurrently herewith, which is incorporated herein by reference for all purposes.

FIELD OF THE INVENTION

The present invention relates generally to Voltage controlled oscillators (VCO's). A VCO with enhanced Q and better signal to noise ration (SNR) is disclosed.

BACKGROUND OF THE INVENTION

Voltage Controlled Oscillators (VCO's) are important components in wireless communication systems. FIG. 1 is a block diagram illustrating a conventional differential cascaded VCO with an LC tank. The output of stage 102 is input to stage 104 and the output of stage 104 is input to stage 106. The output of stage 106 is negatively fed forward to the input of stage 102 with the positive output being fed into the negative input and the negative output being fed into the positive input. The cascaded stages produce a filtering effect with somewhat improved phase noise, but the circuit tends to consume a large amount of current.

It would be desirable if an improved cascaded VCO could be developed with low phase noise so that the signal to noise ratio in the output signal can be reduced. Furthermore, it would be desirable if the amplitude could be increased without increasing the current drawn by the device.

SUMMARY OF THE INVENTION

An improved cascaded VCO is disclosed. In one embodiment, each oscillator stage receives an additional input from a second stage in addition to the conventional input received from a previous stage. The inputs are selected with a phase relationship that causes the total input signal power to each stage to be increased.

It should be appreciated that the present invention can be implemented in numerous ways, including as a process, an apparatus, a system, a device, a method, or a computer readable medium such as a computer readable storage medium or a computer network wherein program instructions are sent over optical or electronic communication links. Several inventive embodiments of the present invention are described below.

In one embodiment, a cascaded voltage controlled oscillator includes a first oscillator stage having a first oscillator stage first input, a first oscillator stage second input and a first oscillator stage output. A second oscillator stage includes a second oscillator stage input and a second oscillator stage output wherein the first oscillator stage output is input to the second oscillator stage input and wherein the second oscillator stage output is fed back to the first oscillator stage second input. A third oscillator stage includes a third oscillator stage input and a third oscillator stage output wherein the second oscillator stage output is fed to the third oscillator stage input.

These and other features and advantages of the present invention will be presented in more detail in the following detailed description and the accompanying figures which illustrate by way of example the principles of the invention.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION

A detailed description of a preferred embodiment of the invention is provided below. While the invention is described in conjunction with that preferred embodiment, it should be understood that the invention is not limited to any one embodiment. On the contrary, the scope of the invention is limited only by the appended claims and the invention encompasses numerous alternatives, modifications and equivalents. For the purpose of example, numerous specific details are set forth in the following description in order to provide a thorough understanding of the present invention. The present invention may be practiced according to the claims without some or all of these specific details. For the purpose of clarity, technical material that is known in the technical fields related to the invention has not been described in detail so that the present invention is not unnecessarily obscured.

Figure 1:
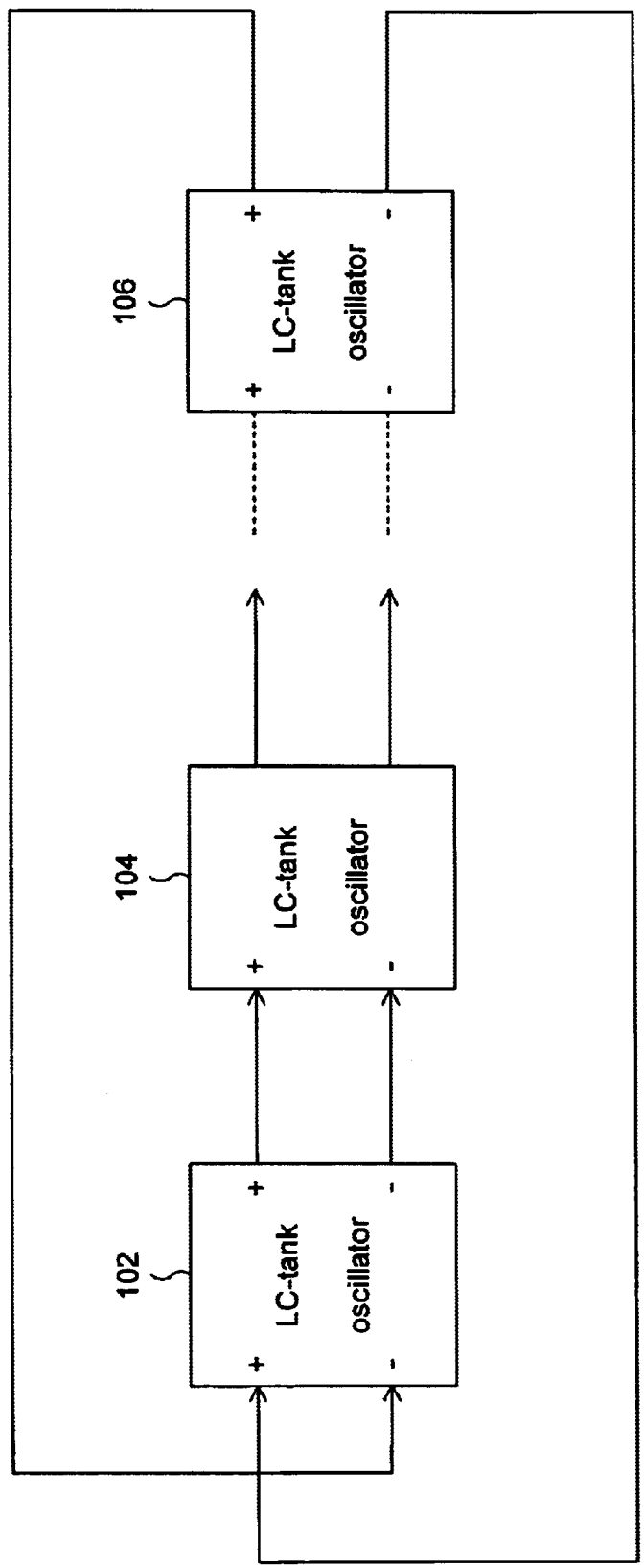
FIG. 1 is a block diagram illustrating a conventional differential cascaded VCO with an LC tank.
Figure 2:
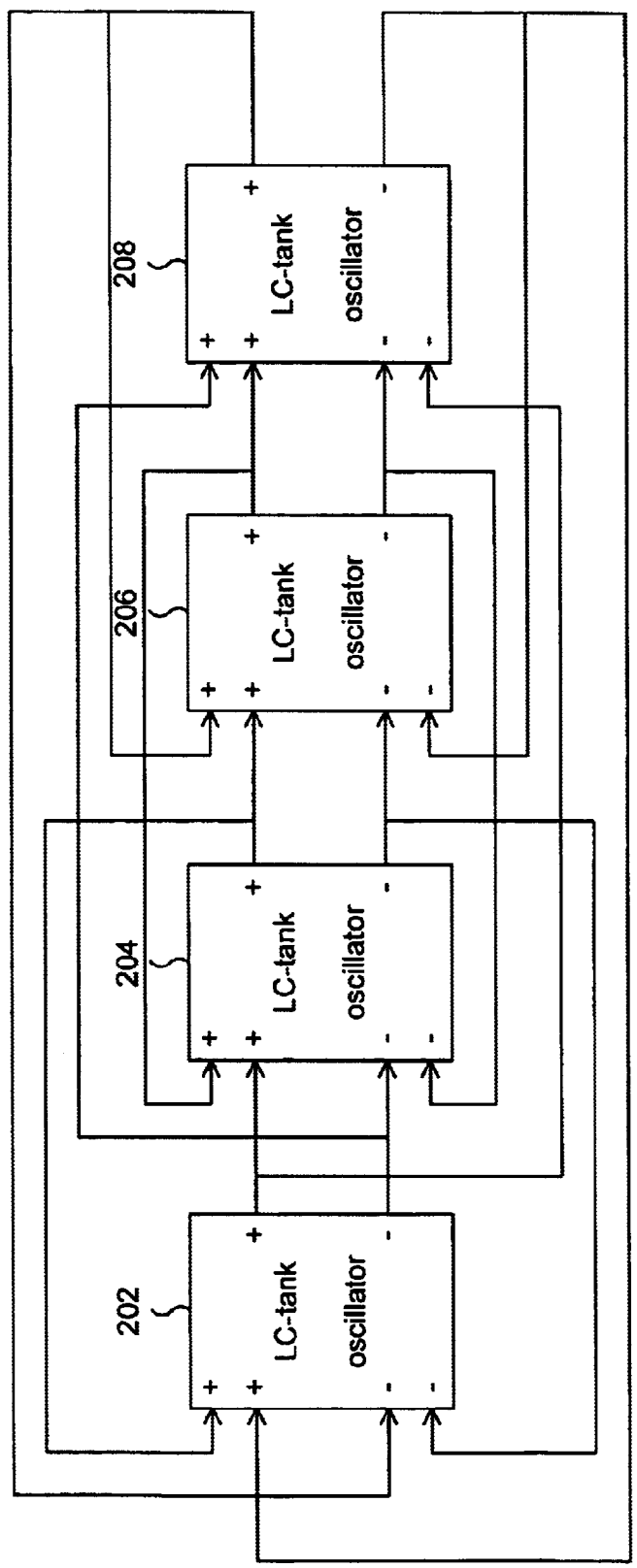
FIG. 2 is a block diagram illustrating a multiple input cascaded LC tank VCO.

FIG. 2 is a block diagram illustrating a multiple input cascaded LC tank VCO. LC tank oscillators are shown in the illustrated embodiment and are referred to extensively herein. In other embodiments, other types of oscillators are used and are connected in a similar manner as shown. In addition, it should be noted that each LC tank oscillator may be single ended. In the example shown, LC tank oscillators with two inputs are shown.

Oscillator stage 204 receives input from stage 202 in a manner similar to that described above. In addition, oscillator stage 204 also receives as an additional input the output signal from oscillator stage 206 which is positively fed back to oscillator stage 204. Similarly, oscillator stage 206 receives input fed forward from stage 204 and fed back positively from stage 208. The output of stage 208 is fed forward negatively to stage 202 with the positive output being input to the negative input and the negative output being input to the positive input. Stage 202 also receives input from the output of stage 204, which is fed back positively. The 45 degree phase difference between the two input signals to each stage of the four stage amplifier causes the input power to be increased and enhances the amplitude of the output. An advantage of this phase arrangement is that the 45 degree added signal tends grow faster than the orthogonally added noise that is introduced, which enhances the SNR.

In other embodiments, different arrangements of the input and output connections are used. In some embodiments, the second input is obtained from a stage that is not immediately next to the stage that is receiving the input, i.e. stages may be skipped. In addition, different numbers of stages are used in other embodiments. The phase relationship among the inputs is arranged so that the input power is increased.

Figure 3:
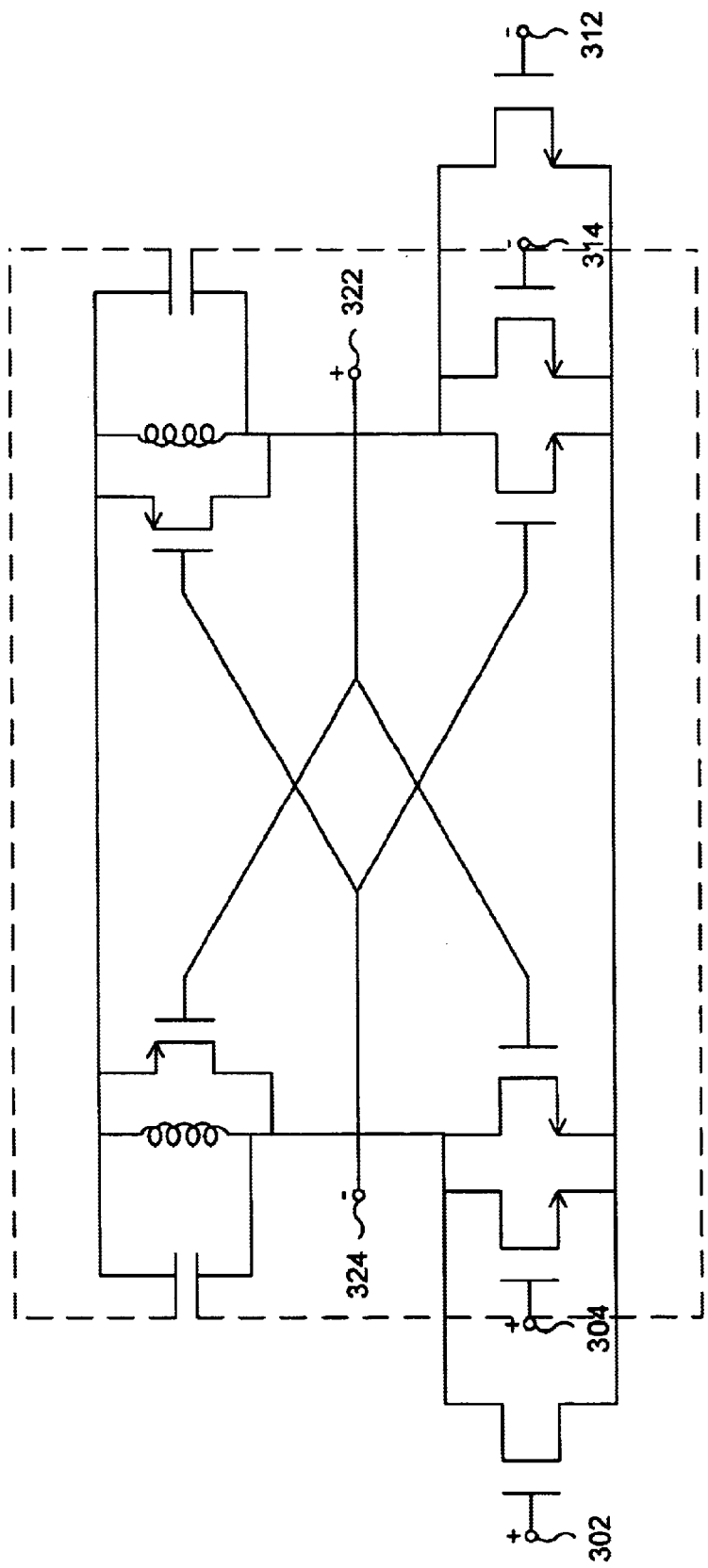
FIG. 3 is a block diagram illustrating a two input LC tank oscillator used in one embodiment.

FIG. 3 is a block diagram illustrating a two input LC tank oscillator used in one embodiment. Oscillator 300 includes positive input nodes 302 and 304 and negative input nodes 312 and 314. The output is taken at output nodes 322 and 324. Advantageously, NMOS transistors are used at the input nodes to increase ramp up speed.

Figure 4:
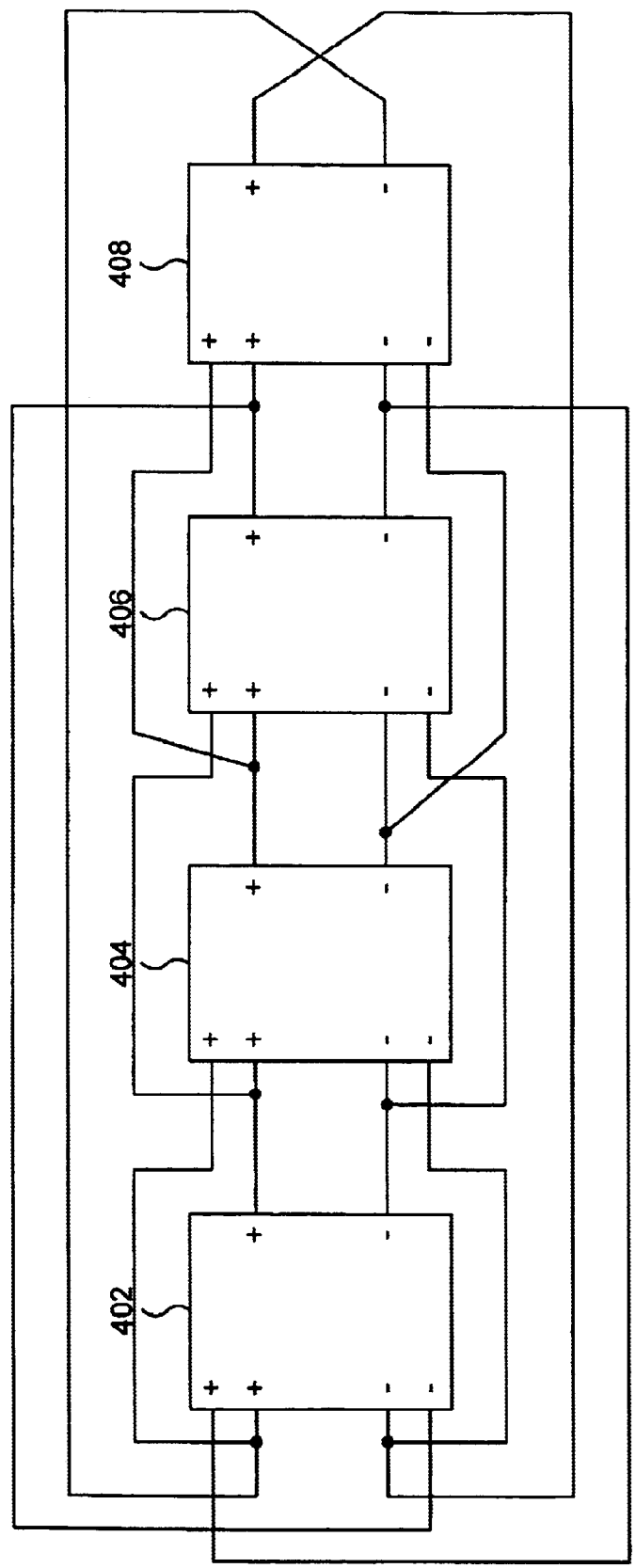
FIG. 4 is a block diagram illustrating a cascaded LC tank oscillator wherein a second input is obtained for each stage by feeding forward the input from a previous stage.

FIG. 4 is a block diagram illustrating a cascaded LC tank oscillator wherein a second input is obtained for each stage by feeding forward the input from a previous stage. Then inputs for stage 404 are obtained from the output of stage 402 and the fed forward input of stage 402. The inputs for stages 406 and 408 are obtained in similar fashion and the inputs for stage 402 are obtained by negatively feeding forward the output of stage 408 and also negatively feeding forward the input from stage 408. The feed forward relationship increases the ramp up rate of the signal.

Figure 5:
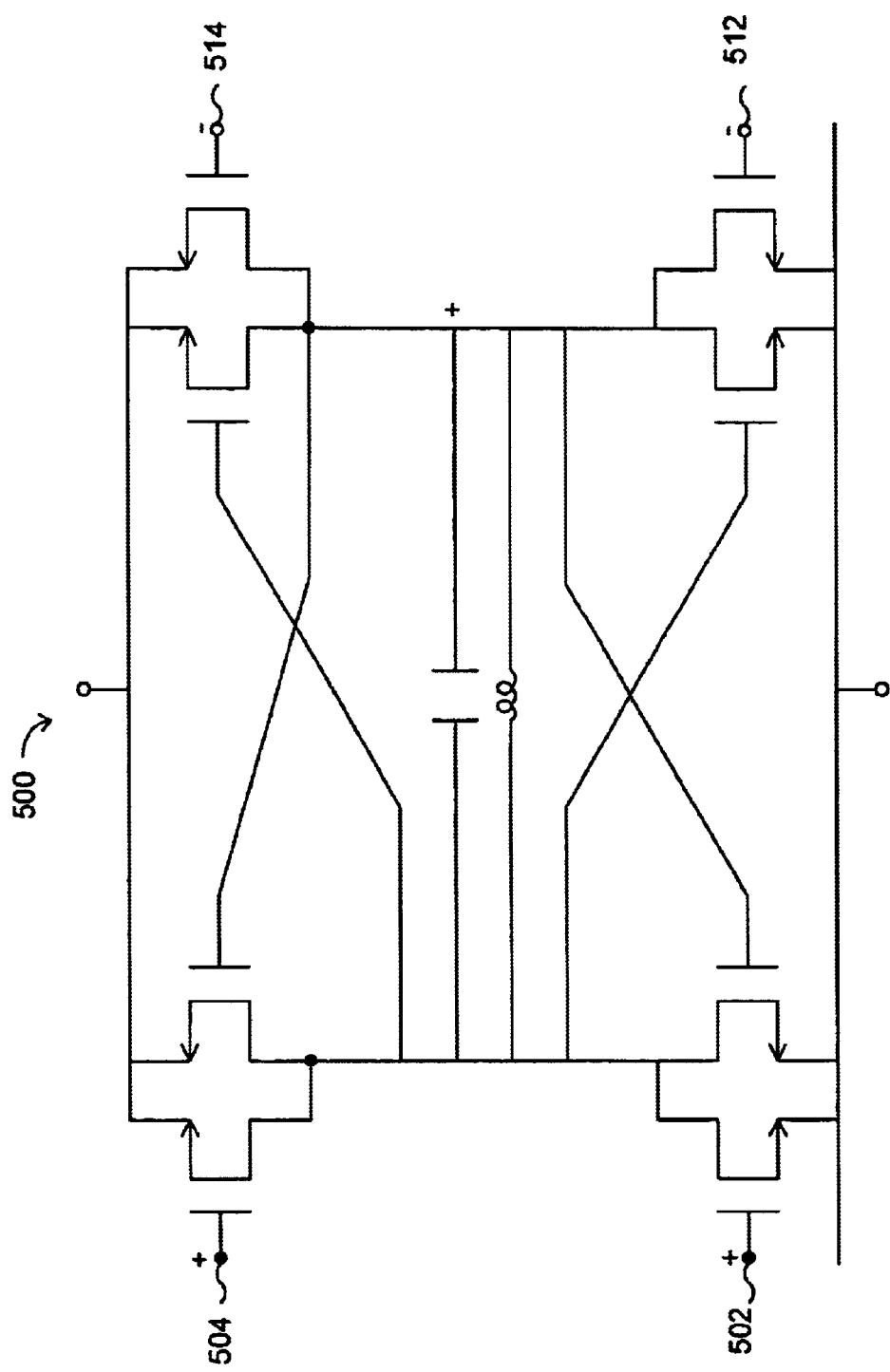
FIG. 5 is a block diagram illustrating an improved oscillator stage for use in the cascaded LC tank oscillator shown in FIG. 4.

FIG. 5 is a block diagram illustrating an improved oscillator stage for use in the cascaded LC tank oscillator shown in FIG. 4. Oscillator stage 500 includes positive input nodes 502 and 504 and negative input nodes 512 and 514. The input from the immediately previous stage is applied across nodes 502 and 512 and the input from one stage before the immediately previous stage is applied across nodes 504 and 514. A combination of NMOS and PMOS devices are used. In general, PMOS devices tend be slower than NMOS. In the design shown, the PMOS devices receive the signal before the NMOS devices and can be slower. Therefore, smaller size PMOS devices (as small as the NMOS devices) can be used. Thus, power consumption is reduced.

An improved cascaded VCO has been described. Each oscillator stage receives an additional input from a second stage in addition to the conventional input received from a previous stage. The inputs are selected with a phase relationship that causes the total input signal power to each stage to be increased. In addition, improved LC tank oscillators have been disclosed for use in such cascaded VCO architectures.

Although the foregoing invention has been described in some detail for purposes of clarity of understanding, it will be apparent that certain changes and modifications may be practiced within the scope of the appended claims. It should be noted that there are many alternative ways of implementing both the process and apparatus of the present invention. Accordingly, the present embodiments are to be considered as illustrative and not restrictive, and the invention is not to be limited to the details given herein, but may be modified within the scope and equivalents of the appended claims.

What is claimed is:

1. A cascaded voltage controlled oscillator comprising:
    a first oscillator stage having a first oscillator stage first input, a first oscillator stage second input and a first oscillator stage output;
    a second oscillator stage having a second oscillator stage input and a second oscillator stage output wherein the first oscillator stage output is input to the second oscillator stage input and wherein the second oscillator stage output is fed back to the first oscillator stage second input;
    a third oscillator stage having a third oscillator stage input and a third oscillator stage output wherein the second oscillator stage output is fed to the third oscillator stage input; and
    a fourth oscillator stage having a fourth oscillator stage input and a fourth oscillator output;
    wherein:
        the oscillator stages are LC tank oscillators;
        the third oscillator stage output is fed to the fourth oscillator stage input;
        the first oscillator stage first input includes a first oscillator stage first positive input and a first oscillator state first negative input;
        the fourth oscillator stage output includes a fourth oscillator stage positive output and a forth oscillator stage negative output; and
        the fourth oscillator stage positive output is fed to the first oscillator stage first negative input and the fourth oscillator stage negative output is fed to the first oscillator stage first positive input.

2. A cascaded voltage controlled oscillator comprising:
    a first oscillator stage having a first oscillator stage first input, a first oscillator stage second input and a first oscillator stage output;
    a second oscillator stage having a second oscillator stage input and a second oscillator stage output wherein the first oscillator stage output is input to the second oscillator stage input and wherein the second oscillator stage output is fed back to the first oscillator stage second input;
    a third oscillator stage having a third oscillator stage input and a third oscillator stage output wherein the second oscillator stage output is fed to the third oscillator stage input;
    wherein the phase relationship of signals being fed to the first oscillator stage first input and the first oscillator stage second input is such that the total input to the first oscillator stage is enhanced and the phase difference between the signal being fed to the first oscillator stage first input and the first oscillator stage second input is approximately 45°.

3. A cascaded voltage controlled oscillator as recited in claim 2 wherein the oscillator stages are LC tank oscillators.

4. A cascaded voltage controlled oscillator as recited in claim 2 wherein there are four oscillator stages.

5. A cascaded voltage controlled oscillator as recited in claim 2 wherein the oscillator stages are single ended.

* * * * *